(12) United States Patent
Hayakawa

(10) Patent No.: US 6,798,804 B2
(45) Date of Patent: Sep. 28, 2004

(54) LASER APPARATUS INCLUDING SURFACE-EMITTING SEMICONDUCTOR EXCITED WITH SEMICONDUCTOR LASER ELEMENT, AND DIRECTLY MODULATED

(75) Inventor: Toshiro Hayakawa, Kaisei-machi (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 198 days.

(21) Appl. No.: 09/779,586

(22) Filed: Feb. 9, 2001

(65) Prior Publication Data

US 2001/0012307 A1 Aug. 9, 2001

(30) Foreign Application Priority Data

Feb. 9, 2000 (JP) ........................................ 2000-031623

(51) Int. Cl.[7] ................................................ H01S 5/00
(52) U.S. Cl. .............................. 372/43; 372/26; 372/46; 372/75; 372/96; 372/98
(58) Field of Search ............................. 372/26, 43, 46, 372/75, 96, 98, 45, 92, 71, 50

(56) References Cited

U.S. PATENT DOCUMENTS

| | | | | |
|---|---|---|---|---|
| 5,365,366 A | * | 11/1994 | Kafka et al. ................. | 359/330 |
| 5,461,637 A | | 10/1995 | Mooradian et al. ............ | 372/92 |
| 5,513,204 A | * | 4/1996 | Jayaraman .................... | 372/75 |
| 5,627,853 A | | 5/1997 | Mooradian et al. ............ | 372/92 |
| 5,796,771 A | * | 8/1998 | DenBaars et al. ............. | 372/75 |
| 5,995,529 A | * | 11/1999 | Kurtz et al. ................... | 372/45 |
| 6,097,742 A | * | 8/2000 | Caprara et al. ............... | 372/22 |
| 6,236,670 B1 | * | 5/2001 | Nagle et al. .................... | 372/50 |
| 6,266,357 B1 | * | 7/2001 | Feld et al. ..................... | 372/46 |
| 6,285,704 B1 | * | 9/2001 | Kullander-Sjoberg et al. ........................... | 372/96 |
| 6,327,293 B1 | * | 12/2001 | Salokatve et al. ............ | 372/96 |
| 6,339,607 B1 | * | 1/2002 | Jiang et al. ................... | 372/75 |
| 6,390,689 B1 | * | 5/2002 | Azimi et al. .................. | 385/88 |
| 6,393,038 B1 | * | 5/2002 | Raymond et al. ............. | 372/22 |
| 6,404,124 B1 | * | 6/2002 | Sakemura et al. .......... | 313/495 |
| 6,438,149 B1 | * | 8/2002 | Tayebati et al. .............. | 372/45 |
| 6,507,593 B1 | * | 1/2003 | Spinelli et al. ............... | 372/98 |
| 6,594,297 B1 | * | 7/2003 | Hayakawa .................... | 372/46 |
| 6,628,696 B2 | * | 9/2003 | Thornton ....................... | 372/98 |

OTHER PUBLICATIONS

Shuji Nakamura et al, "InGaN/GaN/AlGaN–Based Laser Diodes Grown on GaN Substractes with a Fundamental Transverse Mode", Sep. 15, 1998, Jpn. J. Appl. Phys. vol. 37 (1998) L1020–L1022.

Dan Botez "Monolithic Phase–Locked Semiconductor Laser Arrays" Cambridge University Press.

* cited by examiner

Primary Examiner—Don Wong
Assistant Examiner—Cornelius H Jackson
(74) Attorney, Agent, or Firm—Sughrue Mion, PLLC

(57) ABSTRACT

A laser apparatus includes a semiconductor laser element, a surface-emitting semiconductor element including a first mirror, a second mirror, and a modulation unit. The semiconductor laser element emits first laser light having a first wavelength. The surface-emitting semiconductor element is excited with the first laser light, emits second laser light having a second wavelength which is longer than the first wavelength. The first mirror in the surface-emitting semiconductor element is arranged on one side of the first active layer. The second mirror is arranged outside the surface-emitting semiconductor element so that the first and second mirrors form a resonator in which the second laser light resonates. The modulation unit modulates the surface-emitting semiconductor element.

10 Claims, 11 Drawing Sheets

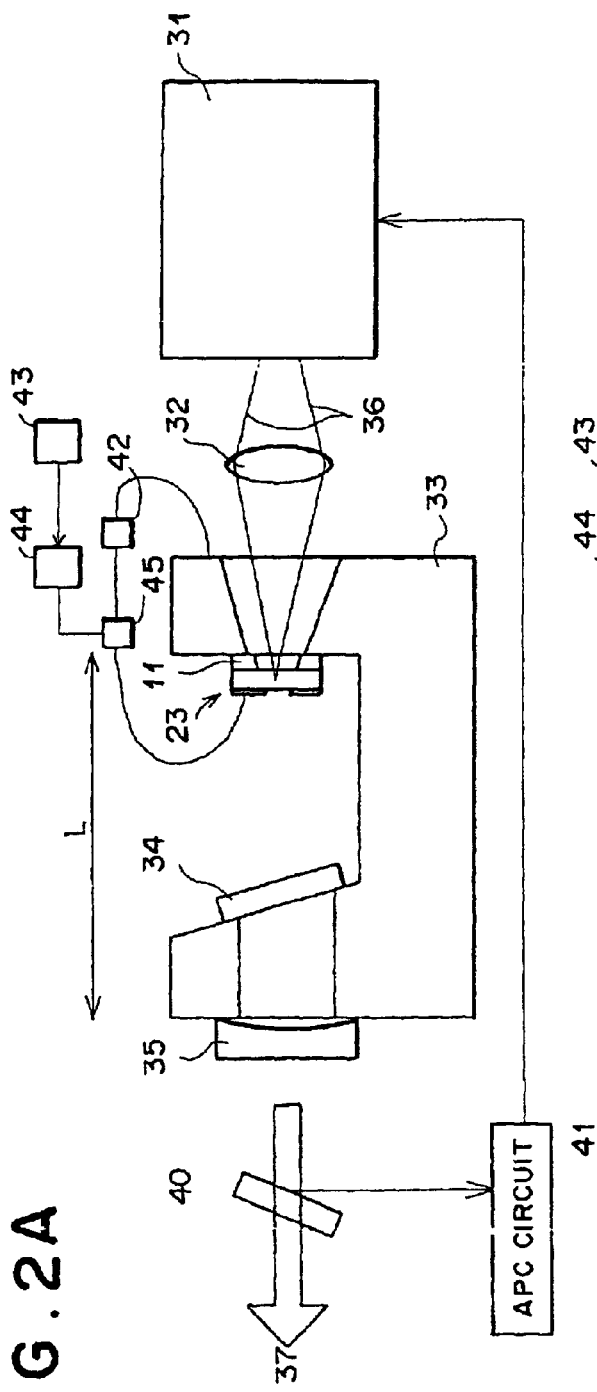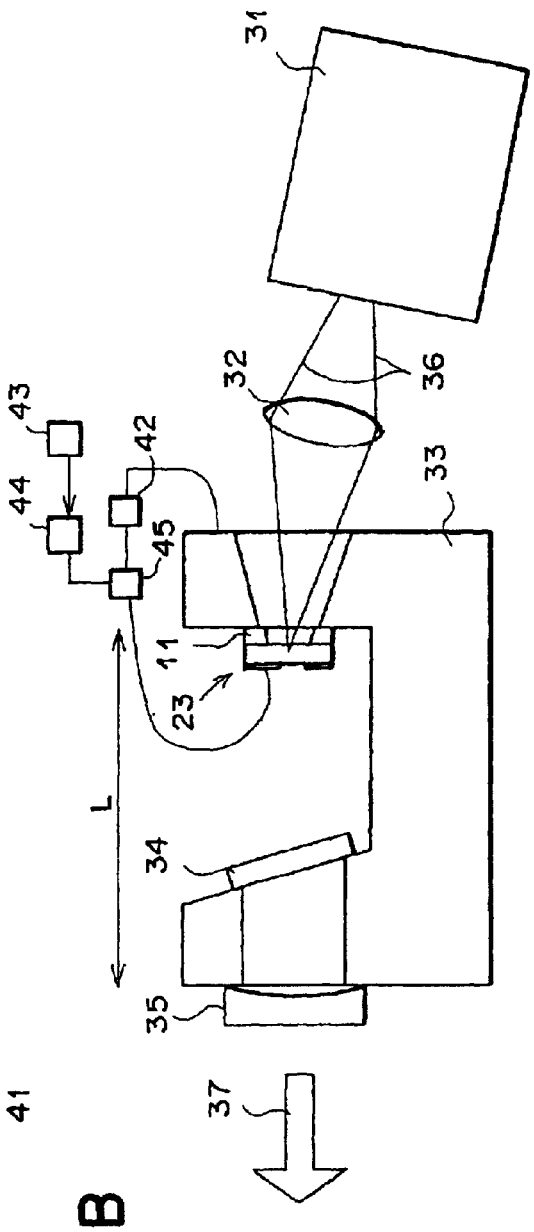
FIG. 2A
FIG. 2B

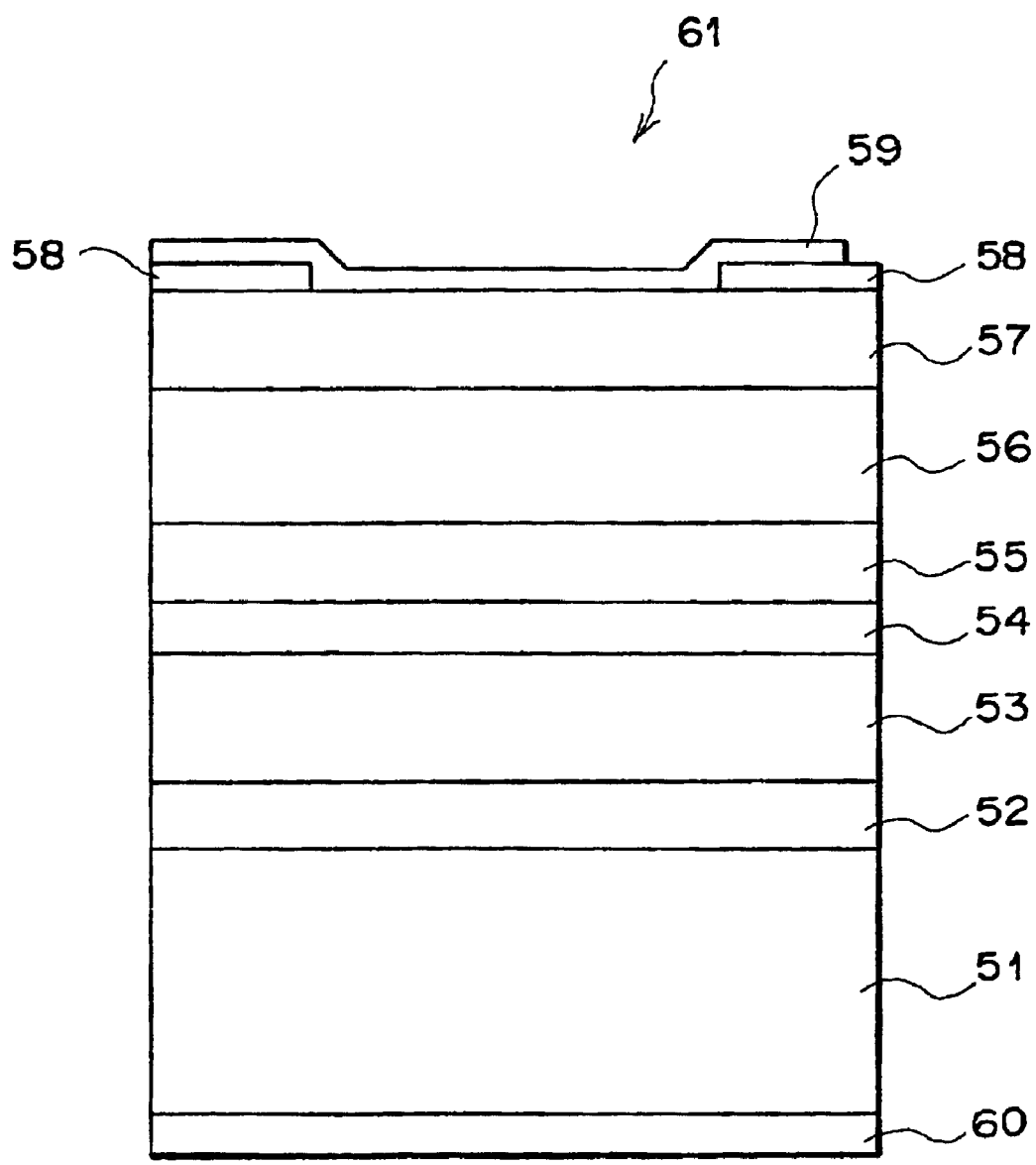

LASER APPARATUS INCLUDING SURFACE-EMITTING SEMICONDUCTOR EXCITED WITH SEMICONDUCTOR LASER ELEMENT, AND DIRECTLY MODULATED

CROSS-REFERENCE TO RELATED APPLICATION

The subject matter disclosed in this specification is related to the subject matter disclosed in the copending, commonly-assigned U.S. patent application (U.S. Ser. No. 09/659,847) filed by the present inventor, entitled "LASER APPARATUS IN WHICH SURFACE-EMITTING SEMICONDUCTOR EXCITED WITH SEMICONDUCTOR LASER ELEMENT AND HIGH-ORDER OSCILLATION MODES ARE SUPPRESSED," filed on Sep. 11, 2000. The contents of this patent application are incorporated herein by reference.

BACKGROUND OF THE INVENTION

1. Field of the Invention

The present invention relates to a laser apparatus which generates a laser beam by exciting a surface-emitting semiconductor element with a semiconductor laser element.

2. Description of the Related Art

Conventionally, narrow-stripe single-transverse-mode semiconductor laser devices are used as a light source in the fields of high-speed information processing, image processing, communications, laser measurement, medicine, printing, and the like, as well as in image display apparatuses such as laser display apparatuses.

However, the conventional narrow-stripe single-transverse-mode semiconductor laser devices, which emit high quality laser beams, have a drawback that the practical output power is at most about 200 to 300 mW. There are two causes of this drawback. The first cause is a so-called spatial hole burning. That is, since the rate of carrier supply for generating laser light is limited by the carrier diffusion process when the output power is high, carrier density decreases in a region where the laser beam intensity is high. Due to the spatial hole burning, the refractive index of the semiconductor medium increases, and the waveguide mode is affected by the increase in the refractive index. Thus, the quality of the laser beams deteriorates, and kinks are produced in the current-light output characteristics. The second cause of the above drawback is the great optical output density. For example, in the case where the stripe width is 4 micrometers, and the equivalent beam diameter in the direction perpendicular to the junction is 0.5 micrometers, the optical output density reaches 15 MW/cm$^2$ when the output power is 300 mW. Therefore, heavy load is imposed on the semiconductor medium, and various characteristics of the semiconductor laser device deteriorate. Thus, it is difficult to obtain a reliable, practical narrow-stripe single-transverse-mode semiconductor laser device which emits laser light with high output power. In other words, it is difficult to increase the practical output power of the narrow-stripe single-transverse-mode semiconductor laser device.

In order to alleviate the above first cause, attempts have been made to optimize the waveguide structure, In addition, in order to alleviate the above second cause, attempts have been made to optimize protection coatings at end surfaces, and window structures at end surfaces have been developed. However, these techniques are approaching their limits. Therefore, in order to realize a narrow-stripe single-transverse-mode semiconductor laser device which emits laser light with high output power, a new mode control technique is necessary, and the optical density must be reduced by increasing the light emission area.

Various attempts have been made to realize a high-power semiconductor laser device which emits spatially coherent laser light, and has an output power of hundreds of watts or more. For example, Botez and Scifres, "Diode Laser Arrays," Cambridge University Press, 1994 discloses a monolithic structure realizing a high quality laser beam, and a process for producing the structure. However, the structure and process are complicated. In addition, in the above attempts, the driving currents of the high-power semiconductor laser devices are 500 mA, 1 A or greater. Therefore, when such high-power semiconductor laser devices are modulated, the amplitudes of the modulation currents become 500 mA, 1 A or greater. Thus, heavy loads are imposed on the driving circuits, and the cost is increased. Further, the variation of the large currents generate strong electromagnetic waves. Therefore, a special electromagnetic shielding is needed. That is, complicated arrangement is required.

In order to remedy the drawbacks of the conventional current-injection type semiconductor laser devices, U.S. Pat. Nos. 5,461,637 and 5,627,853 propose surface-emitting semiconductor laser devices which are excited with light. However, since these semiconductor laser devices utilize the thermal lens effect, i.e., the effect of increasing refractive indexes with temperature, the temperature must be raised. In addition, the above semiconductor laser devices are sensitive to temperature distribution, and the spatial oscillation mode is unstable. The spatial mode becomes further unstable when output power is high, since a cavity is generated in a carrier distribution due to generation of laser light having high output power (i.e., the spatial hole burning occurs), and refractive indexes decrease with increase in the number of carriers due to the so-called plasma effect.

As described above, in the conventional laser apparatus in which a surface-emitting semiconductor element is excited with a semiconductor laser element, a large current is needed to modulate the semiconductor laser element which excites the surface-emitting semiconductor element. Therefore, it is very difficult to obtain a high-speed-modulated laser beam by direct modulation of the semiconductor laser element which excites the surface-emitting semiconductor element.

SUMMARY OF THE INVENTION

The object of the present invention is to provide a high-quality, high-output laser apparatus which can be directly modulated with a small current.

According to the present invention, there is provided a laser apparatus comprising: a semiconductor laser element which emits first laser light having a first wavelength; a surface-emitting semiconductor element which is excited with the first laser light, emits second laser light having a second wavelength which is longer than the first wavelength, and has a first active layer and a first mirror arranged on one side of the first active layer; a second mirror which is arranged outside the surface-emitting semiconductor element so that the first and second mirrors form a resonator in which the second laser light resonates; and a modulation unit which modulates the surface-emitting semiconductor element.

According to the present invention, the surface-emitting semiconductor element is modulated by the modulation unit, while an excitation semiconductor laser element which excites the surface-emitting semiconductor element is modulated in the conventional laser apparatus. Therefore, according to the present invention, high-speed modulation can be achieved with a small modulation current, while a large current is needed for modulating the excitation semiconductor laser element in the conventional laser apparatus.

Preferably, the laser apparatus according to the present invention may also have one or any possible combination of the following additional features (i) to (xii).

(i) When the surface-emitting semiconductor element has a pn junction, the modulation unit can modulate the surface-emitting semiconductor element by varying a voltage applied to the pn junction. The voltage applied to the pn junction is, for example, a reverse bias voltage. When a reverse bias voltage is applied to the pn junction, the laser gain can be decreased. Thus, it is possible to achieve modulation with a high extinction ratio.

(ii) When the surface-emitting semiconductor element has a Schottky junction, the modulation unit can modulate the surface-emitting semiconductor element by varying a voltage applied to the Schottky junction. In this case, modulation of the laser light can be achieved by controlling the gain of the active layer of the surface-emitting semiconductor element.

(iii) The surface-emitting semiconductor element may comprise a structure for controlling a spatial mode of the second laser light. In this case, the surface-emitting semiconductor element can operate in a fundamental transverse mode even when the output power is high.

(iv) In the laser apparatuses having the additional feature (iii), the above structure may be realized by a pinhole spatial filter being arranged at a light-exit end surface of the surface-emitting semiconductor element, having a pinhole, and allowing passage of the second laser light through only the pinhole. In this case, the resonator loss in high-order modes becomes greater than the resonator loss in the fundamental mode. Therefore, the oscillation in the high-order modes can be effectively suppressed, and resultantly oscillation in the fundamental transverse mode is realized.

(v) In the laser apparatuses having the additional feature (iii), the first mirror may have a limited area, be arranged in parallel with a light-exit end surface of the surface-emitting semiconductor element, and realize the above structure. Since the laser light in the fundamental transverse mode can be selectively reflected by the second mirror, the resonator loss in high-order modes becomes greater than the resonator loss in the fundamental mode. Therefore, the oscillation in the high-order modes can be effectively suppressed, and resultantly oscillation in the fundamental transverse mode is realized.

(vi) In the laser apparatuses having the additional feature (iii), the first active layer may be formed in only a limited area in a plane parallel to a light-exit end surface of the surface-emitting semiconductor element, and realize the above structure. In this case, the resonator loss in high-order modes becomes greater than the resonator loss in the fundamental mode. Therefore, the oscillation in the high-order modes can be effectively suppressed, and resultantly oscillation in the fundamental transverse mode is realized.

(vii) In the laser apparatuses having the additional feature (iii), the above structure may have a size which is 0.1 to 10 times as large as a diameter to which the second laser light spreads at the position of the above structure. In this case, the characteristics and the beam shape of the output of the laser apparatus are particularly improved.

(viii) The laser apparatus according to the present invention may further comprise a wavelength selection means arranged in the resonator.

(ix) The laser apparatus according to the present invention may further comprise a polarization control means arranged in the resonator.

(x) The semiconductor laser element may have a second active layer made of an $In_{v1}Ga_{1-v1}N$ material, and the first active layer of the surface-emitting semiconductor element may be made of an $In_{v2}Ga_{1-v2}N$ material, where $0<v1<v2<1$.

(xi) The semiconductor laser element may have a second active layer made of an InGaN material, and the first active layer of the surface-emitting semiconductor element may be made of an AlGaInP or GaInP material.

(xii) The semiconductor laser element may have a second active layer made of an $In_{w1}Ga_{1-w1}As$ material, and the first active layer of the surface-emitting semiconductor element may be made of an $In_{w2}Ga_{1-w2}As$ material, where $0<w1<w2<1$.

In the above items (x) to (xii), "a XY material" means a material which contains at least the elements X and Y when each of X and Y is a symbol of an element.

Details of the above additional features (iii) to (xii) are disclosed in the aforementioned copending and commonly-assigned U.S. patent application filed by the present inventor.

DESCRIPTION OF THE DRAWINGS

FIG. 2A is a diagram illustrating an example of the laser apparatus as the first embodiment of the present invention.

FIG. 2B is a diagram illustrating another example of the laser apparatus as a variation of the first embodiment of the present invention.

FIG. 3 is a cross-sectional view of a surface-emitting semiconductor element which is used in a laser apparatus as a second embodiment of the present invention.

DESCRIPTION OF PREFERRED EMBODIMENTS

Embodiments of the present invention are explained in detail below with reference to drawings.

First Embodiment

Figure 1:
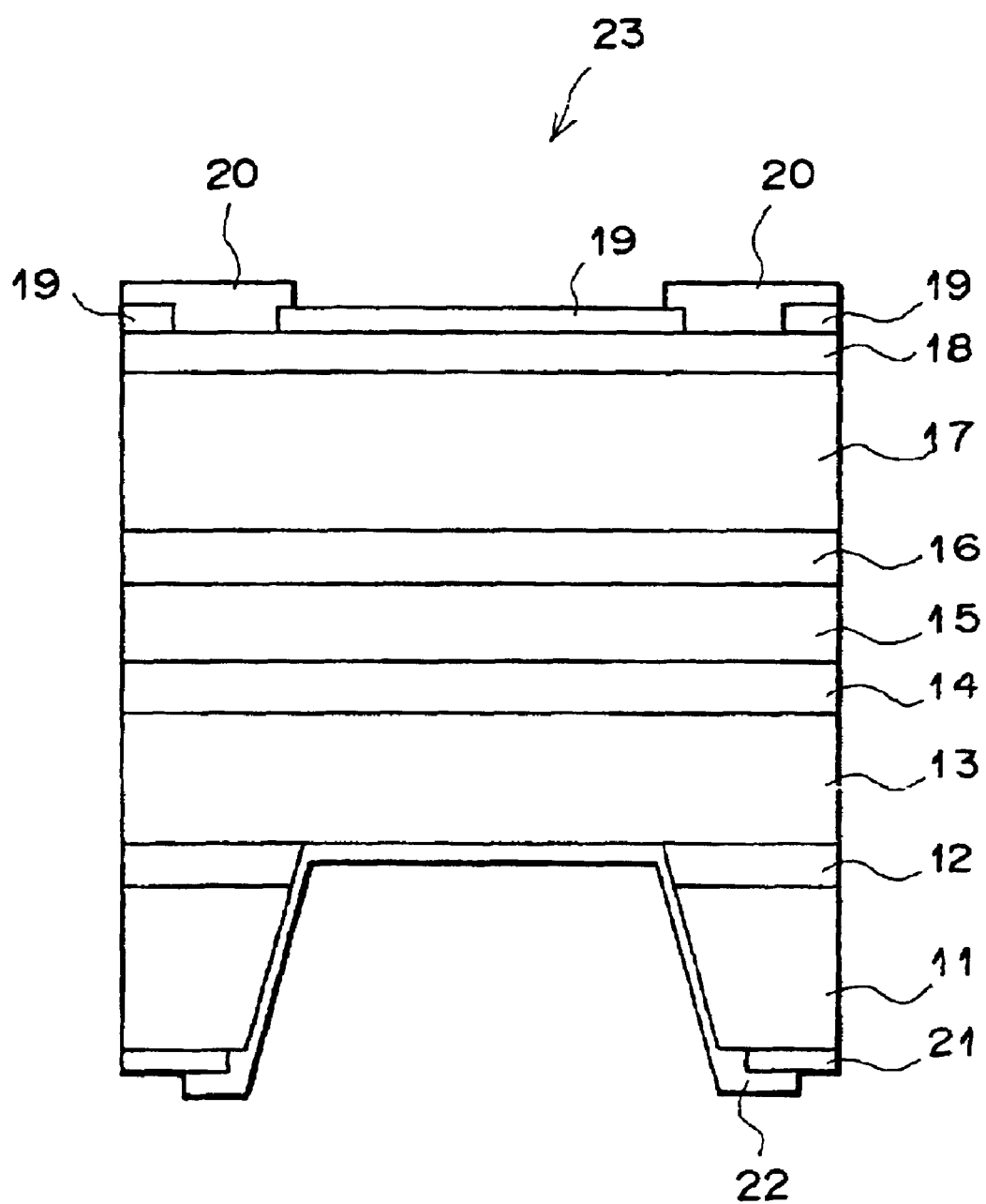
FIG. 1 is a cross-sectional view of a surface-emitting semiconductor element which is used in a laser apparatus as a first embodiment of the present invention.

First, the surface-emitting semiconductor element which is used in the laser apparatus as the first embodiment of the present invention is explained below with reference to FIG. 1, which shows a cross section of the surface-emitting semiconductor element.

Initially, an n-type GaAs buffer layer 12, an n-type GaAs/n-type $Al_{0.7}Ga0.3As$ multilayer optical filter 13, a n-type GaAs optical confinement layer 14, an undoped GaAs/$In_{0.2}Ga_{0.8}As$ multiple-quantum-well active layer 15, a p-type GaAs optical confinement layer 16, a p-type $Al_{0.7}Ga_{0.3}As$ carrier confinement layer 17, and a p-type GaAs cap layer 18 are formed on an n-type GaAs (001) substrate 11 by organometallic vapor phase epitaxy. The lowest sublayer of the n-type GaAs/n-type $Al_{0.7}Ga_{0.3}As$ multilayer optical filter 13 is an AlGaAs layer. Next, a $SiO_2$ antireflection film 19 for laser light emitted from the surface-emitting semiconductor element is formed on the p-type GaAs cap later 18 by electron beam evaporation or the like. A ring-shaped area of the $SiO_2$ antireflection film 19 is removed, and then a Ti/Pt/Au p-electrode 20 is formed by evaporation using the lift-off technique on a ring-shaped area covering the above area from which the $SiO_2$ antireflection film 19 is removed. Thereafter, the n-type GaAs substrate 11 is polished, and regions of the n-type GaAs substrate 11 and the n-type GaAs buffer layer 12 which are broader than an oscillation region of the surface-emitting semiconductor element are removed by selective etching so that a hollow which allows passage of excitation laser light is formed. Then, a AuGe/Ni/Au n-electrode 21 is formed on the remaining area of the back surface of the n-type GaAs substrate 11, and heat treatment is performed so as to make the Ti/Pt/Au p-electrode 20 and the AuGe/Ni/Au n-electrode 21 ohmic electrodes. Next, a $SiO_2$ film 22 is formed so as to cover the inner surface of the hollow, where the $SiO_2$ film 22 functions as an antireflection film for excitation laser light having the wavelength of 810 nm. Finally, the layered structure formed as above is cleaved, and is further formed into a chip of the surface-emitting semiconductor element 23.

The above n-type GaAs/n-type $Al_{0.7}Ga_{0.3}As$ multilayer optical filter 13 is designed to exhibit a high reflectance of 90% or more at the oscillation wavelength of 980 nm and a low reflectance of 5% or less at the excitation wavelength (the wavelength of the excitation laser light) of 810 nm. For example, the multilayer optical filter 13 may include about twenty pairs of n-type GaAs and n-type $Al_{0.7}Ga_{0.3}As$ sublayers each having a thickness corresponding to one-quarter of a wavelength which is longer than the oscillation wavelength.

Next, the laser apparatus as the first embodiment of the present invention is explained below with reference to FIG. 2A, which shows an example of the laser apparatus as the first embodiment of the present invention. As illustrated in FIG. 2A, the laser apparatus as the first embodiment comprises a broad-area semiconductor laser element 31 as an excitation light source, a heatsink 33 having openings, the surface-emitting semiconductor element 23 bonded to the heatsink 33 at the surface of the substrate 11, a condenser lens 32, an external mirror 35, and a partial mirror 40.

The broad-area semiconductor laser element 31 includes an active layer made of InGaAsP, AlGaAs, or AlGaInAs, has a stripe width of 100 micrometers, and emits the excitation laser light 36 having a wavelength of 810 nm. A resonator having a length L is formed between the concave surface of the external mirror 35 and the n-type GaAs/n-type $Al_{0.7}Ga_{0.3}As$ multilayer optical filter 13 of the surface-emitting semiconductor element 23, and a wavelength selection element 34 is arranged in the resonator. In addition, the surface-emitting semiconductor element 23 is provided with modulation means for modulating the surface-emitting semiconductor element 23. The modulation means comprises a DC bias circuit 42, a signal source 43, a modulation circuit 44, and a mixer 45. The n-type GaAs/n-type $Al_{0.7}Ga_{0.3}As$ multilayer optical filter 13 functions as a mirror.

In the construction of FIG. 2A, the excitation laser light 36 being emitted from the broad-area semiconductor laser element 31 and having a wavelength of 810 nm is collected by the condenser lens 32 into the surface-emitting semiconductor element 23, is then efficiently absorbed in the optical confinement layers 14, 16 and the multiple-quantum-well active layer 15, and excites the surface-emitting semiconductor element 23. Light emitted by the surface-emitting semiconductor element 31 resonates in the resonator, and laser light 37 having the wavelength of about 980 nm is output through the external mirror 35. For example, the laser light 37 is supplied to an optical deflector for use in recording an image.

Further, a portion of the laser light 37 is branched off by the partial mirror 40, and supplied to an optical detector (not shown), and the automatic power control (APC) circuit 41 controls the driving current of the broad-area semiconductor laser element 31 so that the output power of the laser light 37 is maintained constant.

Since the surface-emitting semiconductor element 23 includes a pn junction, it is possible to modulate the surface-emitting semiconductor element 23 by varying a voltage applied to the pn junction with the modulation means. For example, the modulation circuit 44 in the modulation means receives a binary image signal from the signal source 43, and outputs a positive or negative voltage signal to the mixer 45 according to the binary image signal. The mixer 45 superimposes the voltage signal on a bias voltage output from the DC bias circuit 42. That is, a voltage applied to the pn junction rises above and drops below the bias voltage according to the binary image signal. Therefore, the gain of the active layer of the surface-emitting semiconductor element 23 varies according to the binary image signal. Thus, the intensity of the laser light emitted from the surface-emitting semiconductor element 23 is modulated according to the binary image signal.

Alternatively, when the modulation circuit 44 in the modulation means receives from the signal source 43 an image signal which represents graded densities of an image, the modulation circuit 44 outputs to the mixer 45 a voltage signal according to the image signal, where the voltage signal represents a variation from the bias voltage. Accordingly, the gain of the active layer of the surface-emitting semiconductor element 23 can be varied stepwise or continuously according to the image signal. Thus, the intensity of the laser light emitted from the surface-emitting semiconductor element 23 can be modulated stepwise or continuously according to the image signal. The present invention realizes modulation at a higher speed with a smaller modulation current than the conventional modulation of the semiconductor laser element which requires a large modulation current.

Due to the provision of the heatsink 33 as illustrated in FIG. 2A, heat generated by the surface-emitting semiconductor element can be efficiently dissipated.

According to a design of this embodiment, the beam diameter is 0.3 mm when the beam diameter is defined as a diameter of a beam spread within which the intensity of the beam is $1/e^2$ or more of the peak intensity. Further, in order to suppress laser light generated by oscillation in high-order modes, which spreads widely, the diameter of the pinhole formed in the p electrode 20 is set to 0.6 mm. Although controllability of the spatial mode is improved with decrease in the diameter of the pinhole, the amount of laser light in the fundamental mode stopped by the pinhole also increases, i.e., the loss increases, when the pinhole is too small. Therefore, it is preferable that the diameter of the pinhole is 0.1 to 10 times the beam diameter so as to achieve a desired characteristic.

The wavelength selection element is arranged in the resonator in order to realize oscillation in a single longitudinal mode, and may be, for example, a Lyot filter or an etalon. In addition, more than one Lyot filter or etalon may be arranged in the resonator. Further, in order to control the polarization, a Brewster plate may be arranged in the resonator.

The laser apparatus as the first embodiment has the following advantages.

(a) Since the semiconductor laser element 31 as the excitation light source can be a broad-area type as described with reference to FIG. 1, the semiconductor laser element 31 can emit laser light with high output power (e.g., 1 to 10 watts). Therefore, the laser apparatuses of FIGS. 2A and 2B can emit laser light of hundreds of milliwatts to several watts. The beam area at the light-exiting end surface of the broad-area semiconductor laser element is typically (0.15 mm)$^2$X$\pi$=70,650 $\mu$m$^2$, while the beam areas at the light-exiting end surfaces of the aforementioned narrow-stripe single-transverse-mode semiconductor laser devices are about 2 $\mu$m$^2$. That is, the beam area of the broad-area semiconductor laser element is 10$^4$ times greater than beam areas of narrow-stripe single-transverse-mode semiconductor laser devices.

(b) The surface-emitting semiconductor element in the first embodiment is excited with light, and is therefore different from the conventional semiconductor laser elements driven by current injection, in that the surface-emitting semiconductor element 44 is free from heat generation and decrease in efficiency due to increase in electrical resistance in a multilayer semiconductor reflection mirror or the like. The conventional surface-emitting semiconductor elements must have a complicated structure in order to reduce electrical resistance in multilayer semiconductor reflection mirrors or the like. For example, local doping is performed, or layers having graded compositions are arranged between sublayers constituting a multilayer optical filter. However, the surface-emitting semiconductor element excited with light does not require such a complicated structure, and can be produced by a simple process.

Alternatively, the incident direction of the excitation laser light 36 from the semiconductor laser element 31 may be inclined as illustrated in FIG. 2B. Although not shown, the APC circuit 41 as illustrated in FIG. 2A may also be provided in the construction of FIG. 2B.

Second Embodiment

The surface-emitting semiconductor element which is used in the laser apparatus as the second embodiment of the present invention is explained below with reference to FIG. 3, which shows a cross section of the surface-emitting semiconductor element. The surface-emitting semiconductor element of FIG. 3 is excited with excitation laser light emitted from a semiconductor laser element, and oscillates at the wavelength of 980 nm. The surface-emitting semiconductor element used in the second embodiment is produced as follows.

An n-type GaAs buffer layer 52, a Bragg reflection film 53, an n-type GaAs optical confinement layer 54, an undoped GaAs/In$_{0.2}$Ga$_{0.8}$As multiple-quantum-well active layer 55, an n-type GaAs optical confinement layer 56, and an n-type Al$_{0.7}$Ga$_{0.3}$As carrier confinement layer 57 are formed on an n-type GaAs (001) substrate 51 by organo-metallic vapor phase epitaxy. The Bragg reflection film 53 is comprised of twenty pairs of n-type GaAs and n-type Al$_{0.7}$Ga$_{0.3}$As sublayers, the n-type GaAs sublayer in each pair has a thickness of $\lambda/4n_{GaAs}$, the n-type Al$_{0.7}$Ga$_{0.3}$As sublayer in each pair has a thickness o $\lambda/4n_{A10.7Ga0.3As}$, $\lambda$ is an oscillation wavelength of the surface-emitting semiconductor element of FIG. 3, and $n_{GaAs}$ and $n_{A10.7Ga0.3As}$ are the refractive indexes of GaAs and Al$_{0.7}$Ga$_{03}$As at the oscillation wavelength $\lambda$, respectively. The lowest sublayer of the Bragg reflection film 53 is an AIGaAs layer. Thereafter, the back surface of the n-type GaAs substrate 51 is polished, and a AuGe/Ni/Au n-electrode 60 is formed on the n-type GaAs substrate 51, and heat treatment is performed so as to make the AuGe/Ni/Au n-electrode 60 an ohmic electrode. Then, a Ti/Au Schottky electrode 58 is formed by electron beam evaporation, where the Ti/Au Schottky electrode 58 has a window through which laser light exits. Then, a SiO$_2$ antireflection film 59 having a thickness of $\lambda/4n_{SiO2}$ is formed over exposed area of the n-type Al$_{0.7}$Ga$_{0.3}$As carrier confinement layer 57, where $n_{SiO2}$ is the refractive index of SiO$_2$ at the oscillation wavelength $\lambda$. Finally, the construction of FIG. 3 is cleaved and formed into a chip. Thus, the surface-emitting semiconductor element 61 is completed. In contrast to the first embodiment, no portion of the n type GaAs substrate 51 or the n-type GaAs buffer layer 52 is removed.

Figure 4:
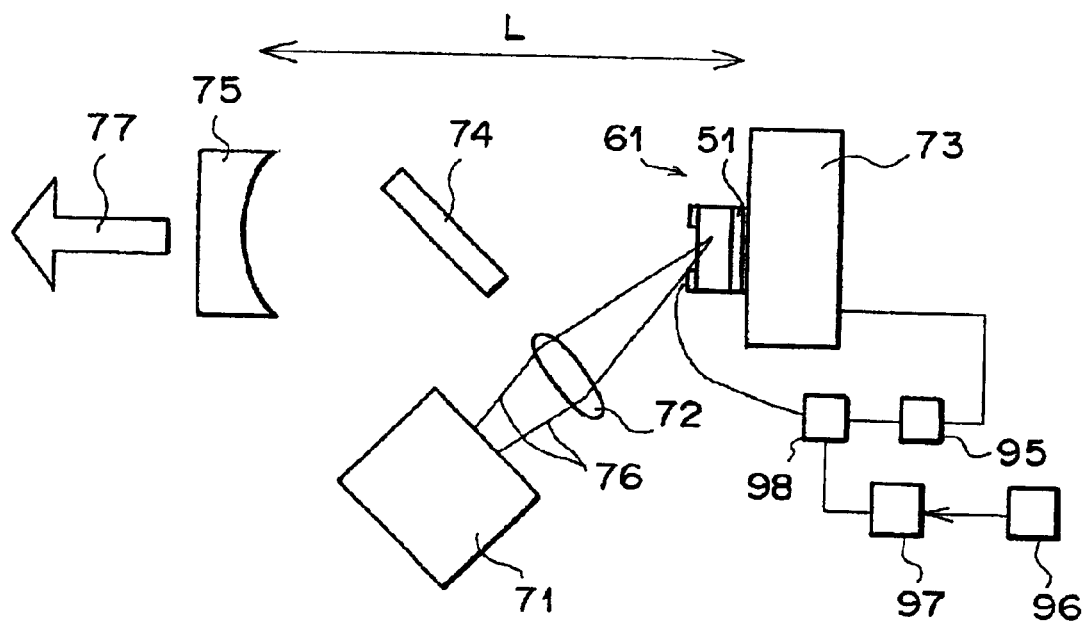
FIG. 4 is a diagram illustrating an example of the laser apparatus as the second embodiment of the present invention.

FIG. 4 exhibits an example of the laser apparatus as the second embodiment of the present invention. As illustrated in FIG. 4, the laser apparatus as the second embodiment comprises a broad-area semiconductor laser element 71 as an excitation light source, a heatsink 73, the surface-emitting semiconductor element 61 bonded to the heatsink 73 at the surface of the substrate 51, a condenser lens 72, and an external mirror 75.

The broad-area semiconductor laser element 71 includes an active layer made of InGaAsP, AlGaAs, or AlGaInAs, and emits excitation laser light 76 having a wavelength in the 810 nm band. A resonator having a length L is formed between the concave surface of the external mirror 75 and the Bragg reflection film 53 of the surface-emitting semiconductor element 61, and a polarization control element 74 is arranged in the resonator. In addition, the surface-emitting semiconductor element 61 is provided with a modulation means for modulating the surface-emitting semiconductor element 61. The modulation means comprises a DC bias circuit 95, a signal source 96, a modulation circuit 97, and a mixer 98. The Bragg reflection film 53 functions as a mirror.

In the construction of FIG. 4, the excitation laser light 76 being emitted from the broad-area semiconductor laser element 71 and having a wavelength of 810 nm is collected by the condenser lens 72 into the surface-emitting semiconductor element 61, is then efficiently absorbed in the optical confinement layers 54, 56 and the multiple-quantum-well active layer 55, and excites the surface-emitting semiconductor element 61. Light emitted by the surface-emitting semiconductor element 61 resonates in the resonator, and laser light 77 having the wavelength of about 980 nm is output through the external mirror 75.

Since the forward side (opposite to the GaAs substrate 51) of the active layer of the surface-emitting semiconductor element 61 is not shielded from the excitation laser light 76, the surface-emitting semiconductor element 61 can be excited from the forward side.

Further, since the entire surface of the substrate 51 of the surface-emitting semiconductor element 61 is fixed to the heatsink 73, heat generated by the surface-emitting semiconductor element 61 can be effectively dissipated. Therefore, the arrangement of the heatsink 73 illustrated in FIG. 4 allows the surface-emitting semiconductor element 61 to operate with high power.

Since the surface-emitting semiconductor element 61 includes a Schottky junction, it is possible to modulate the surface-emitting semiconductor element 61 by varying a voltage applied to the Schottky junction with the modulation means. For example, the modulation circuit 97 in the modulation means receives a binary image signal from the signal source 96, and outputs to the mixer 98 a positive or negative voltage signal according to the binary image signal. The mixer 98 superimposes the voltage signal on a bias voltage output from the DC bias circuit 95. That is, a voltage applied to the Schottky junction rises above and drops below the bias voltage according to the binary image signal. Therefore, the gain of the active layer of the surface-emitting semiconductor element 61 varies according to the binary image signal. Thus, the intensity of the laser light emitted from the surface-emitting semiconductor element 61 is modulated according to the binary image signal. Alternatively, when the modulation circuit 97 in the modulation means receives from the signal source 96 an image signal which represents graded densities of an image, the intensity of the laser light emitted from the surface-emitting semiconductor element 61 can be modulated stepwise or continuously according to the image signal in a similar manner to the first embodiment. The present invention realizes modulation at a higher speed with a smaller modulation current than the conventional modulation of the semiconductor laser element which requires a large modulation current.

Further, in the construction of FIG. 4, a partial mirror may be arranged on the forward side of the external mirror 75. In this case, a portion of the laser light 77 can be branched off by the partial mirror, and supplied to an optical detector, and the driving current of the broad-area semiconductor laser element 71 can be controlled by an automatic power control (APC) circuit so that the output power of the laser light 77 is maintained constant.

Although, in the first and second embodiments, the excitation wavelength is 810 nm, and the oscillation wavelength is 980 nm, laser apparatuses similar to the first and second embodiments can be realized when the excitation wavelength is shorter than the oscillation wavelength. When the oscillation wavelength is in the range of approximately 750 to 880 nm, the active layer of the surface-emitting semiconductor element can be made of AlGaAs, InGaAsP, AlGaInAs, or the like. In this case, the active layer of the semiconductor laser element emitting the excitation laser light can be made of InGaP, AlInGaP, or the like, which emits light having a shorter wavelength than the active layer of the surface-emitting semiconductor element. Alternatively, the active layer of the semiconductor laser element can be made of AlGaAs, InGaAsP, AlGaInAs, or the like when the composition of the material of the active layer of the semiconductor laser element is controlled so as to emit light having a shorter wavelength than the active layer of the surface-emitting semiconductor element.

Third Embodiment

Figure 5:
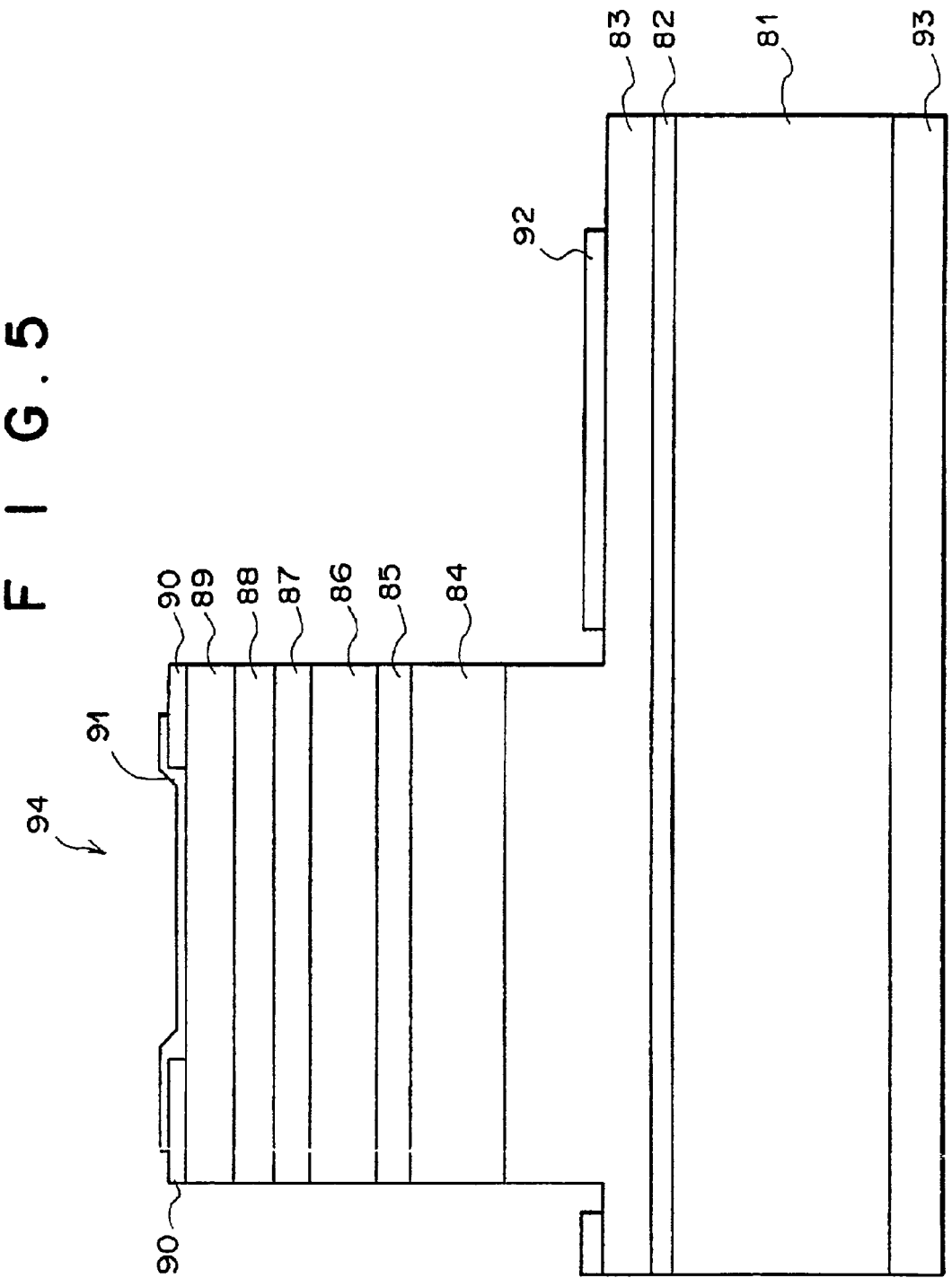
FIG. 5 is a cross-sectional view of a surface-emitting semiconductor element which is used in a laser apparatus as a third embodiment of the present invention.
Figure 6:
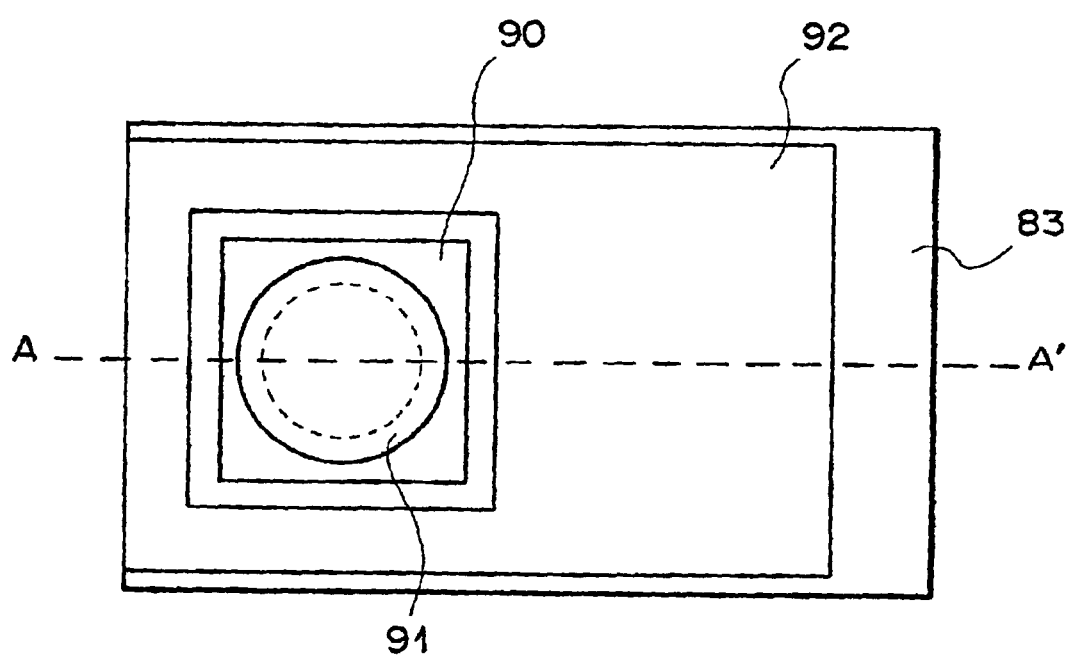
FIG. 6 is a plan view of the surface-emitting semiconductor element used in the laser apparatus as the third embodiment of the present invention.

The surface-emitting semiconductor element which is used in the laser apparatus as the third embodiment of the present invention is explained below with reference to FIGS. 5 and 6, where FIG. 6 is a plan view of the surface-emitting semiconductor element, and FIG. 5 is a cross-sectional view of the surface-emitting semiconductor element in the A–A' cross section indicated in FIG. 6. The surface-emitting semiconductor element used in the third embodiment is produced as follows.

A GaN low-temperature buffer layer 82, an n-type GaN buffer layer 83, a Bragg reflection film 84, an n-type GaN optical confinement layer 85, an $In_{x2}Ga_{1-x2}N/In_{x3}Ga_{1-x3}N$ multiple-quantum-well active layer 86 ($0<x2<x3<0.5$), an p-type GaN optical confinement layer 87, an n-type $Al_{z4}Ga_{1-z4}N$ carrier confinement layer 88 ($z4>0$), and a p-type GaN cap layer 89 are formed on a sapphire C-face substrate 81 by organometallic vapor phase epitaxy. The Bragg reflection film 84 is comprised of twenty pairs of n-type GaN and n-type AlN sublayers, the n-type GaN sublayer in each pair has a thickness of $\lambda/4n_{GaN}$, the n-type AlN sublayer in each pair has a thickness of $\lambda/4n_{AlN}$, $\lambda$ is an oscillation wavelength of the surface-emitting semiconductor element of FIG. 5, and $n_{GaN}$ and $n_{AlN}$ are the refractive indexes of GaN and AlN at the oscillation wavelength $\lambda$, respectively. The lowest sublayer of the Bragg reflection film 84 is an AlN layer.

Next, as illustrated in FIG. 6, the areas around the oscillation portion of the surface-emitting semiconductor element 94 are removed by reactive ion beam etching (RIBE) using chloric gas until the n-type GaN buffer layer 83 is exposed. Then, as illustrated in FIG. 5, a Ni/Au p-electrode 90 is formed on the p-type GaN cap layer 89 except for the light emission area, and a Ti/Al n-electrode 92 is formed on the exposed area of the n-type GaN buffer layer 83 by evaporation. Heat treatment is performed so as to make the Ni/Au p-electrode 90 and the Ti/Al n-electrode 92 ohmic electrodes. Next, an antireflection coating 91 being made of $ZrO_2$ and having a thickness of $\lambda/4n_{ZrO2}$ is formed over the exposed area of the p-type GaN cap layer 89 by electron beam evaporation or the like, where $n_{ZrO2}$ is the refractive index of $ZrO_2$ at the oscillation wavelength $\lambda$. Thereafter, the back surface of the sapphire C-face substrate 81 is polished, and a $ZrO_2$ film 93 is formed over the back surface of the sapphire C-face substrate 81, where the $ZrO_2$ film 93 has such a thickness that the $ZrO_2$ film 93 functions as an antireflection coating at the wavelength of 370 nm of the excitation laser light. Finally, the construction of FIGS. 5 and 6 is cleaved and formed into a chip. Thus, the surface-emitting semiconductor element 94 is completed.

Figure 7:
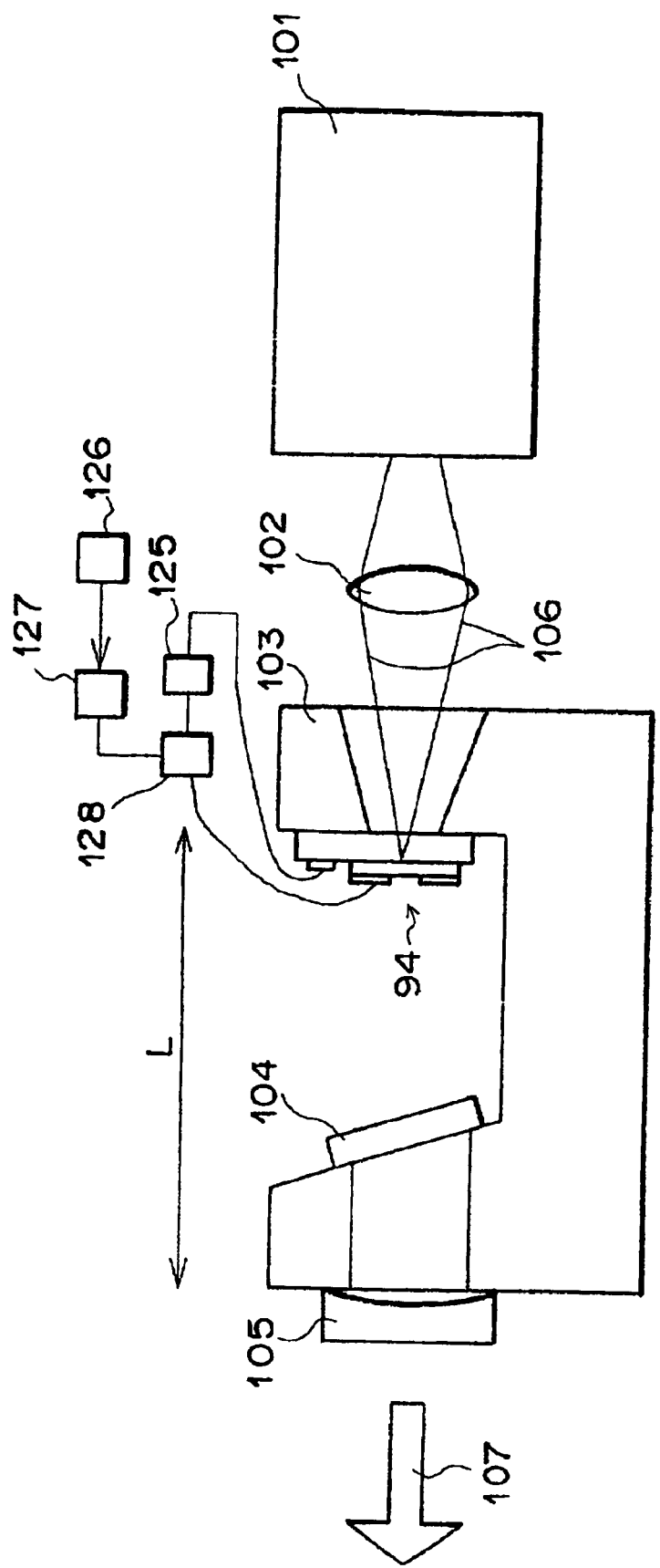
FIG. 7 is a diagram illustrating an example of the laser apparatus as the third embodiment of the present invention.

FIG. 7 shows an example of the laser apparatus as the third embodiment of the present invention. As illustrated in FIG. 7, the laser apparatus as the third embodiment comprises a broad-area semiconductor laser element 101 as an excitation light source, a heatsink 103 having openings, the surface-emitting semiconductor element 94 bonded to the heatsink 103 at the surface of the substrate 81, a condenser lens 102, and an external mirror 105.

The broad-area semiconductor laser element 101 includes an active layer made of InGaN, and emits laser light having a wavelength in the range of 370 to 420 nm. A resonator having a length L is formed between the concave surface of the external mirror 105 and the Bragg reflection film 84 of the surface-emitting semiconductor element 94, and a wavelength selection element 104 is arranged in the resonator. In addition, the surface-emitting semiconductor element 94 is provided with a modulation means for modulating the surface-emitting semiconductor element 94. The modulation means comprises a DC bias circuit 125, a signal source 126, a modulation circuit 127, and a mixer 128. The Bragg reflection film 84 functions as a mirror.

In the construction of FIG. 7, excitation laser light 106 being emitted from the broad-area semiconductor laser element 101 and having a wavelength in the range of 370 to 420 nm is collected by the condenser lens 102 into the surface-emitting semiconductor element 94, is then efficiently absorbed in the optical confinement layers 85, 87 and the multiple-quantum-well active layer 86, and excites the surface-emitting semiconductor element 94. Light emitted by the surface-emitting semiconductor element 94 resonates in the resonator, and laser light 107 having the wavelength in the range of approximately 400 to 550 nm is output through the external mirror 105.

Since the surface-emitting semiconductor element 94 is provided with the modulation means, it is possible to modulate the laser light output from the surface-emitting semiconductor element 94 by varying a voltage applied to the pn junction in a similar manner to the first embodiment.

Further, in the construction of FIG. 7, a partial mirror may be arranged on the forward side of the external mirror 105. In this case, a portion of the laser light 107 can be branched off by the partial mirror, and supplied to an optical detector, and the driving current of the broad-area semiconductor laser element 101 can be controlled by an automatic power control (APC) circuit so that the output power of the laser light 107 is maintained constant.

Fourth Embodiment

Figure 8:
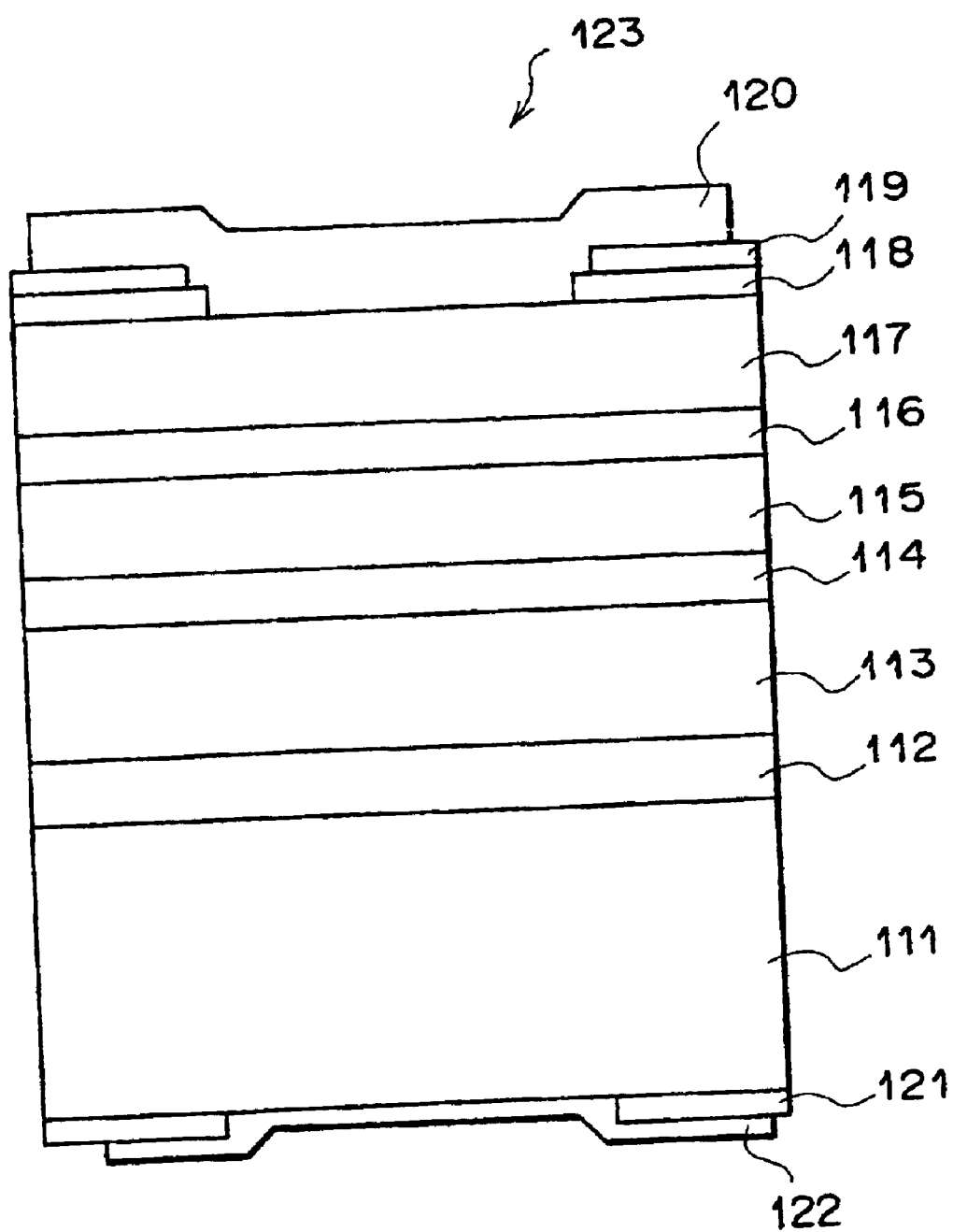
FIG. 8 is a cross-sectional view of a surface-emitting semiconductor element which is used in a laser apparatus as a fourth embodiment of the present invention.

The surface-emitting semiconductor element which is used in the laser apparatus as the fourth embodiment of the present invention is explained below with reference to FIG. 8, which shows a cross section of the surface-emitting semiconductor element. The surface-emitting semiconductor element used in the fourth embodiment is produced as follows.

First, an n-type GaN (0001) substrate 111 is formed in accordance with the method disclosed by S. Nakamura et al., "InGaN/GaN/AlGaN-Based Laser Diodes Grown on GaAs Substrate with a Fundamental Transverse Mode", Japanese Journal of Applied Physics Part 2 Letters, vol. 37, 1998, pp. L1020. Then, an n-type GaN buffer layer 112, an n-type $Al_{z4}Ga_{1-z4}N$ carrier confinement later 113 (z4>0), an n-type GaN optical confinement later 114, an $In_{x2}Ga_{1-x2}N/In_{x3}Ga_{1-x3}N$ multiple-quantum-well active layer 115 (0<x2<x3<0.5), a p-type GaN optical confinement later 116, a p-type AlN/P-type GaN multilayer film 117, a p-type GaN cap layer 118, a Ni/Au p-electrode 119, and a $SiO_2/ZrO_2$ multilayer film 120 are formed on the n-type GaN (0001) substrate 111 by organometallic vapor phase epitaxy. The p-type AlN/p-type GaN multilayer film 117 is comprised of two pairs of p-type AlN and p-type GaN sublayers, the p-type AlN sublayer in each pair has a thickness of $\lambda/4n_{AlN}$, the p-type GaN sublayer in each pair has a thickness of $\lambda/4n_{GaN}$, $\lambda$ is an oscillation wavelength of the surface-emitting semiconductor element of FIG. 8, and $n_{AlN}$ and $n_{GaN}$ are the refractive indexes of AlN and GaN at the oscillation wavelength $\lambda$, respectively. The lowest sublayer of the p-type AlN/P-type GaN multilayer film 117 is an AlN layer. The $SiO_2/ZrO_2$ multilayer film 120 is comprised of twelve pairs of $SiO_2$ and $ZrO_2$ sublayers, the $SiO_2$ sublayer in each pair has a thickness of $\lambda/4n_{SiO2}$, the $ZrO_2$ sublayer in each pair has a thickness of $\lambda/4n_{ZrO2}$, and $n_{SiO2}$ and $n_{ZrO2}$ are the refractive indexes of $SiO_2$ and $ZrO_2$ at the oscillation wavelength $\lambda$, respectively. The p-type AlN/p-type GaN multilayer film 117 and the $SiO_2/ZrO_2$ multilayer film 120 realize a Bragg reflection film.

In addition, a Ti/Al n-electrode 121 is formed on the back surface of the n-type GaN (0001) substrate 111, and a round-shaped central portion of the Ti/Al n-electrode 121 is removed. Then, a $ZrO_2$ antireflection film 122 is formed over the exposed area of the back surface of the n-type GaN (0001) substrate 111. Finally, the construction of FIG. 8 is cleaved and formed into a chip. Thus, the surface-emitting semiconductor element 123 is completed.

Figure 9:
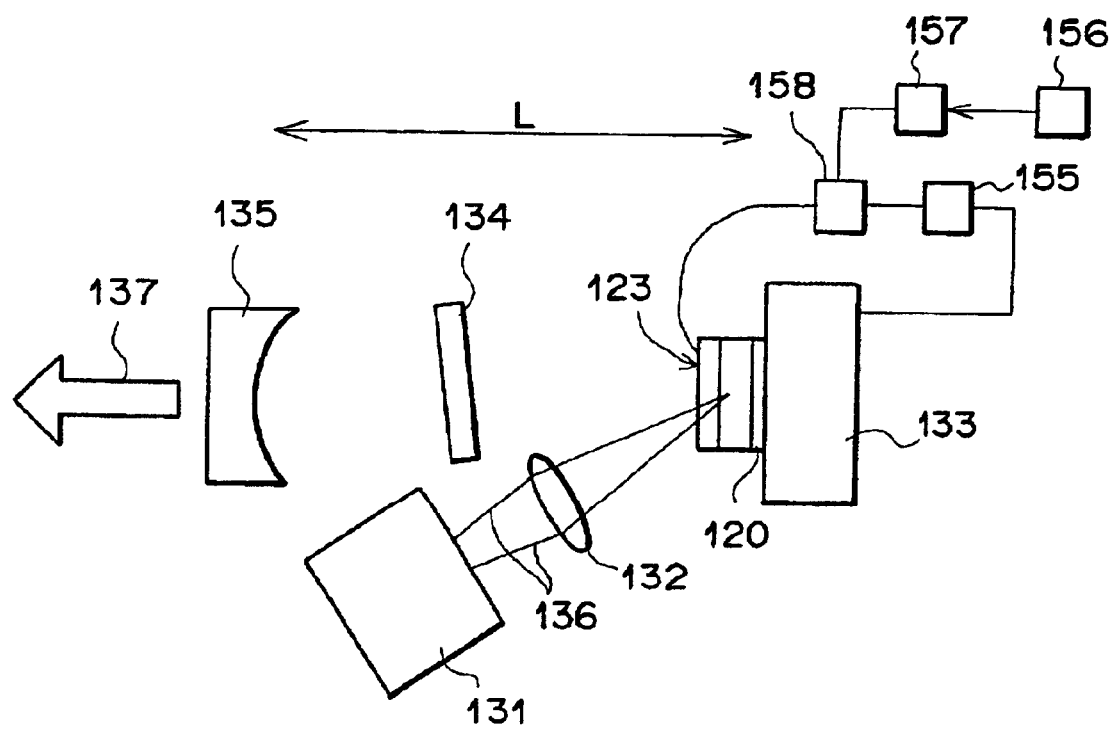
FIG. 9 is a diagram illustrating an example of the laser apparatus as the fourth embodiment of the present invention.

FIG. 9 exhibits an example of the laser apparatus as the fourth embodiment of the present invention. As illustrated in FIG. 9, the laser apparatus as the fourth embodiment comprises a broad-area semiconductor laser element 131 as an excitation light source, a heatsink 133, the surface-emitting semiconductor element 123 bonded to the heatsink 133 on the side of the Bragg reflection film, a condenser lens 132, and an external mirror 135.

The broad-area semiconductor laser element 131 includes an active layer made of InGaN, and emits laser light having a wavelength in the range of 370 to 420 nm. A resonator having a length L is formed between the concave surface of the external mirror 135 and the Bragg reflection film realized by the p-type AlN/p-type GaN multilayer film 117 and the $SiO_2/ZrO_2$ multilayer film 120. In addition, a wavelength selection element 134 is arranged in the resonator. Further, the surface-emitting semiconductor element 123 is provided with a modulation means for modulating the surface-emitting semiconductor element 123. The modulation means comprises a DC bias circuit 155, a signal source 156, a modulation circuit 157, and a mixer 158. The p-type AlN/p-type GaN multilayer film 117 functions as a mirror.

In the construction of FIG. 9, excitation laser light 136 being emitted from the broad-area semiconductor laser element 131 and having a wavelength in the range of 370 to 420 nm is collected by the condenser lens 132 into the surface-emitting semiconductor element 123, is then efficiently absorbed in the optical confinement layers 114, 116 and the multiple-quantum-well active layer 115, and excites the surface-emitting semiconductor element 123. Light emitted by the surface-emitting semiconductor element 123 resonates in the resonator, and laser light 137 having the wavelength in the range of approximately 400 to 550 nm is output through the external mirror 135.

Since the surface-emitting semiconductor element 123 is provided with the modulation means, it is possible to modulate the laser light output from the surface-emitting semiconductor element 123 by varying a voltage applied to the pn junction in a similar manner to the first embodiment.

Further, in the construction of FIG. 9, a partial mirror may be arranged on the forward side of the external mirror 135. In this case, a portion of the laser light 137 can be branched off by the partial mirror, and supplied to an optical detector, and the driving current of the broad-area semiconductor laser element 131 can be controlled by an automatic power control (APC) circuit so that the output power of the laser light 137 is maintained constant.

Fifth Embodiment

Figure 10:
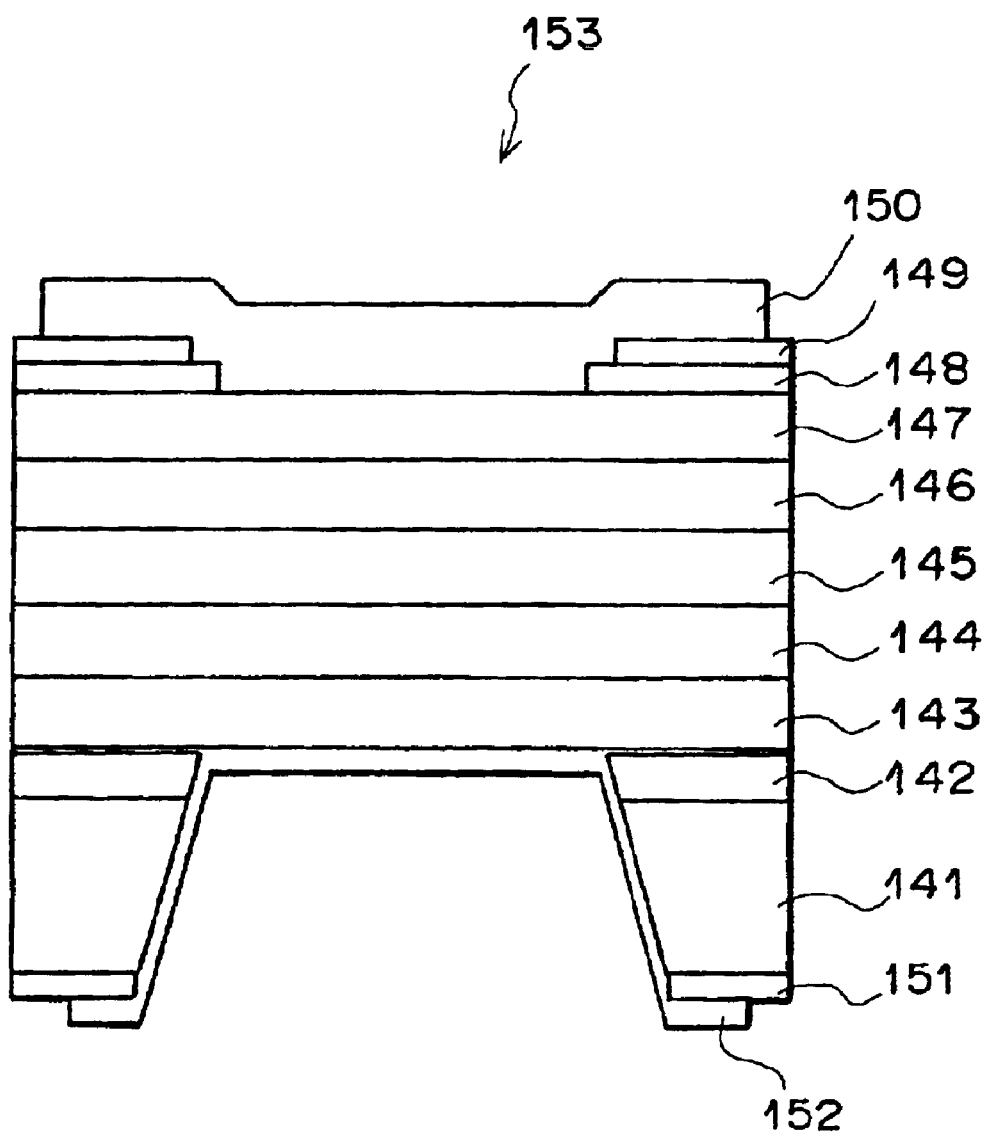
FIG. 10 is a cross-sectional view of a surface-emitting semiconductor element which is used in a laser apparatus as a fifth embodiment of the present invention.

The surface-emitting semiconductor element which is used in the laser apparatus as the fifth embodiment of the present invention is explained below with reference to FIG. 10, which shows a cross section of the surface-emitting semiconductor element. The surface-emitting semiconductor element used in the fifth embodiment emits laser light having a wavelength of 650 nm. The surface-emitting semiconductor element used in the fifth embodiment is produced as follows.

Initially, an n-type GaAs buffer layer 142, an $In_{0.5}(Ga_{1-x5}Al_{x5})_{0.5}P$ carrier confinement layer 143, an n-type $In_{0.5}(Ga_{1-x2}Al_{x2})_{0.5}P$ optical confinement layer 144, an $In_{0.5}(Ga_{1-x3}Al_{x3})_{0.5}P/In_{0.5}(Ga_{1-x4}Al_{x4})_{0.5}P$ multiple-quantum-well active layer 145 ($0 \leq x3 < x4 \leq x2 < x5 \leq 1$), a p-type $In_{0.5}(Ga_{1-x2}Al_{x2})_{0.5}P$ optical confinement layer 146, a p-type $In_{0.5}(Ga_{1-x5}Al_{x5})_{0.5}P$ carrier confinement layer 147, and a p-type GaAs cap layer 148 are formed on a n-type GaAs (001) substrate 141. Thereafter, a light emitting area of the p-type GaAs cap layer 148 is removed by chemical etching, and a Ti/Pt/Au p-electrode 149 is formed on the remaining area of the p-type GaAs cap layer 148 by evaporation, and heat treatment is performed so as to make the Ti/Pt/Au p-electrode 149 an ohmic electrode. Then, a $SiO_2/TiO_2$ multilayer optical filter 150 is formed over the exposed area of the p-type $In_{0.5}(Ga_{1-x5}Al_{x5})_{0.5}P$ carrier confinement layer 147 by electron beam evaporation. Next, the substrate 141 is polished, and areas of the n-type GaAs substrate 141 and the n-type GaAs buffer layer 142 which cover the light emission region of the surface-emitting semiconductor element are removed by etching using sulfuric acid as an etchant, as illustrated in FIG. 10. Thereafter, a AuGe/Ni/Au n-electrode 151 is formed on the remaining area of the back surface of the n-type GaAs (001) substrate 141 by evaporation, and heat treatment is performed so as to make the AuGe/Ni/Au n-electrode 151 an ohmic electrode. Then, an antireflection film 152 is formed over the exposed areas of the n-type GaAs (001) substrate 141, the n-type GaAs buffer layer 142, and the $In_{0.5}(Ga_{1-x5}Al_{x5})_{0.5}P$ carrier confinement layer 143. Thus, the surface-emitting semiconductor element 153 is completed.

Figure 11:
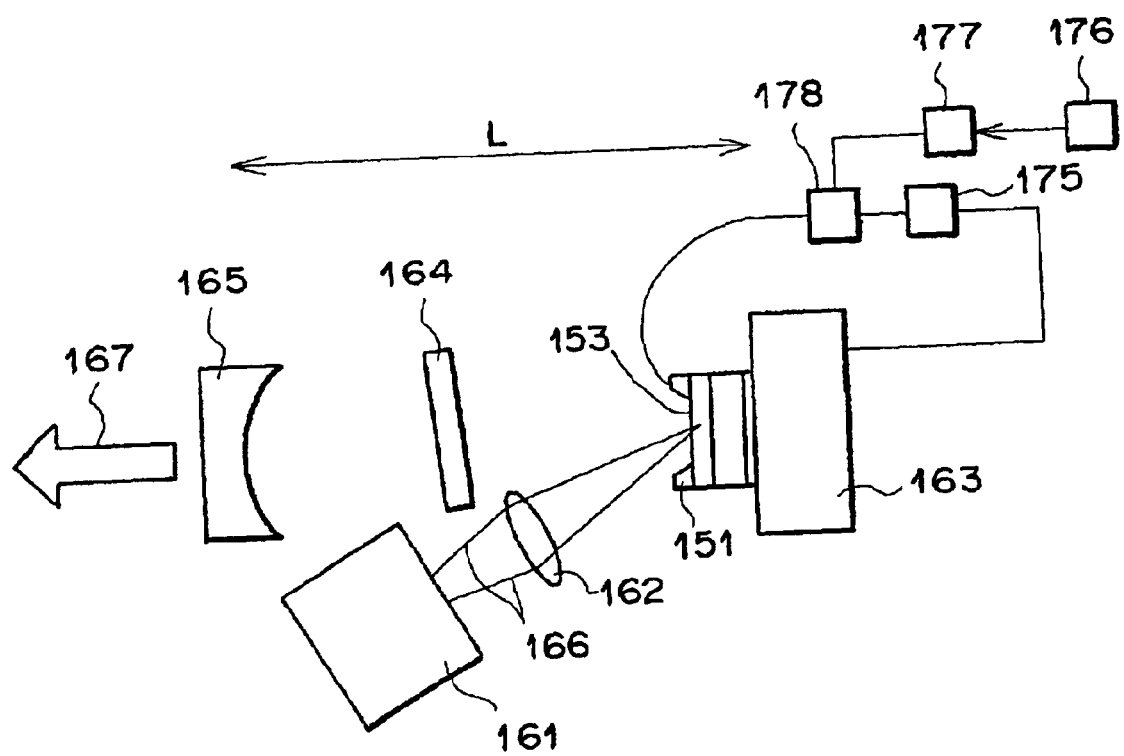
FIG. 11 is a diagram illustrating an example of the laser apparatus as the fifth embodiment of the present invention.

FIG. 11 exhibits an example of the laser apparatus as the fifth embodiment of the present invention. As illustrated in FIG. 11, the laser apparatus as the fifth embodiment comprises a broad-area semiconductor laser element 161 as an excitation light source, a heatsink 163, the surface-emitting semiconductor element 153 bonded to the heatsink 163 on the side of the $SiO_2/TiO_2$ multilayer optical filter 150, a condenser lens 162, and an external mirror 165.

The broad-area semiconductor laser element 161 includes an active layer made of InGaN, and emits laser light having a wavelength of 400 nm. A resonator having a length L is formed between the concave surface of the external mirror 165 and the $SiO_2/TiO_2$ multilayer optical filter 150. In addition, a polarization control element 164 (e.g., a Brewster plate) is arranged in the resonator. Further, the surface-emitting semiconductor element 153 is provided with a modulation means for modulating the surface-emitting semiconductor element 153. The modulation means comprises a DC bias circuit 175, a signal source 176, a modulation circuit 177, and a mixer 178.

In the construction of FIG. 11, excitation laser light 166 being emitted from the broad-area semiconductor laser element 161 and having a wavelength of 400 nm is collected by the condenser lens 162 into the surface-emitting semiconductor element 153, is then efficiently absorbed in the optical confinement layers 144, 146 and the multiple-quantum-well active layer 145, and excites the surface-emitting semiconductor element 153. Light emitted by the surface-emitting semiconductor element 153 resonates in the resonator, and laser light 167 having the wavelength of approximately 650 nm is output through the external mirror 165.

Since the surface-emitting semiconductor element 153 is provided with the modulation means, it is possible to modulate the laser light output from the surface-emitting semiconductor element 153 by varying a voltage applied to the pn junction in a similar manner to the first embodiment.

In the surface-emitting semiconductor element 184, the $SiO_2/TiO_2$ multilayer optical filter 150 has a high reflectance of 90% or more at the wavelength of the laser light 167, and a low reflectance of 5% or less, preferably 1% or less, at the wavelength of the excitation laser light 166.

Additional Matters (i) The semiconductor laser elements for emitting excitation laser light used in the present invention are not limited to the broad-area semiconductor laser element, and may be array-type semiconductor laser elements, α-DFB (angled grating-distributed feedback) semiconductor lasers, or MOPA (master oscillator power amplifier) semiconductor lasers. In particular, the MOPA semiconductor lasers, which have a tapered structure, enable high-density light collection.

(ii) When a film being transparent to the oscillation light and exhibiting a certain reflectance for the excitation laser light is arranged on the oscillation-light exit side of a surface-emitting semiconductor element, and the excitation laser light is supplied to the surface-emitting semiconductor element from the rearfacing side (opposite to the oscillation-light exit side), the surface-emitting semiconductor element can be excited with not only a directly absorbed portion of the excitation laser light, but also a portion reflected by the above film. Therefore, when the absorption coefficient of the surface-emitting semiconductor element for the excitation laser light is small, the surface-emitting semiconductor element can be efficiently excited with the excitation laser light by arranging the above film on the oscillation-light exit side of the surface-emitting semiconductor element.

(iii) The laser device according to the present invention can be used as a light source in the fields of high-speed information processing, image processing, communications, laser measurement, medicine, printing, and the like.

What is claimed is:

1. A laser apparatus comprising:
   a semiconductor laser element which emits first laser light having a first wavelength;
   a surface-emitting semiconductor element which has an active layer and a first mirror arranged on one side of said active layer, said surface-emitting semiconductor being excited with said first laser light;
   a second mirror which is arranged outside said surface-emitting semiconductor element so that said first and second mirrors form a resonator which oscillates second laser light having a second wavelength which is longer than said first wavelength; and
   a modulation unit which modulates a gain of said active layer;
   wherein said second mirror is physically separated from said surface-emitting semiconductor element by an air gap.

2. A laser apparatus according to claim 1, wherein said surface-emitting semiconductor element has a pn junction, and said modulation unit modulates said gain of said active layer by varying a voltage applied to the pn junction.

3. A laser apparatus according to claim 1, wherein said surface-emitting semiconductor element has a Schottky junction, and said modulation unit modulates said gain of said active layer by varying a voltage applied to the Schottky junction.

4. The laser apparatus according to claim 1, wherein said first laser light enters said resonator from a first surface of said first mirror which is opposite the active layer to excite the surface-emitting semiconductor element.

5. The laser apparatus according to claim 1, wherein said first laser light enters said surface-emitting semiconductor element through said air gap.

6. A laser apparatus according to claim 1, wherein said surface-emitting semiconductor element comprises a structure for controlling a spatial mode of said second laser light.

7. A laser apparatus according to claim 6, wherein said structure is realized by a pinhole spatial filter being arranged at a light-exit end surface of said surface-emitting semiconductor element, having a pinhole, and allowing passage of said second laser light through only the pinhole.

8. A laser apparatus according to claim 6, wherein said structure is realized by said first mirror which has a limited area is arranged in parallel with a light-exit end surface of said surface-emitting semiconductor element.

9. A laser apparatus according to claim 6, wherein said structure is realized by said active layer which is formed in only a limited area in a plane parallel to a light-exit end surface of said surface-emitting semiconductor element.

10. A laser apparatus according to claim 6, wherein said structure has a size which is 0.1 to 10 times as large as a diameter to which said second laser light spreads at a position of the structure for controlling the spatial mode of the second laser light.

* * * * *